(12) United States Patent
Moon et al.

(10) Patent No.: US 8,481,356 B2
(45) Date of Patent: Jul. 9, 2013

(54) METHOD FOR MANUFACTURING A BACK CONTACT SOLAR CELL

(75) Inventors: In Sic Moon, Seongnam-si (KR); Eun Chel Cho, Yongin-si (KR); Won Jae Lee, Seongnam-si (KR); Jong Keun Lim, Yongin-si (KR)

(73) Assignee: Hyundai Heavy Industries Co., Ltd. (KR)

( * ) Notice: Subject to any disclaimer, the term of this patent is extended or adjusted under 35 U.S.C. 154(b) by 0 days.

(21) Appl. No.: 13/519,227

(22) PCT Filed: Dec. 17, 2010

(86) PCT No.: PCT/KR2010/009066
§ 371 (c)(1),
(2), (4) Date: Jun. 26, 2012

(87) PCT Pub. No.: WO2011/081336
PCT Pub. Date: Jul. 7, 2011

(65) Prior Publication Data
US 2012/0288980 A1  Nov. 15, 2012

(30) Foreign Application Priority Data
Dec. 28, 2009 (KR) .......... 10-2009-0131577

(51) Int. Cl.
*H01L 21/00* (2006.01)
(52) U.S. Cl.
USPC .......... 438/72; 438/57; 438/97; 438/98; 257/E31.127; 257/E31.124; 257/E31.001; 136/459; 136/252; 136/255; 136/256

(58) Field of Classification Search
USPC .......... 438/57, 72, 97–98, 548, 558, 563, 438/703; 257/E31.127, E31.124, E31.001; 136/459, 252, 255–256, 258
See application file for complete search history.

(56) References Cited

U.S. PATENT DOCUMENTS
2005/0268963 A1  12/2005  Jordan et al.

FOREIGN PATENT DOCUMENTS
JP  2000-077690 A  3/2000
KR  1020070004672 A  1/2007

OTHER PUBLICATIONS
Written Opinion for International Application No. PCT/KR2010/009066 dated Sep. 21, 2011.
International Search Report for International Application No. PCT/KR2010/009066 dated Sep. 21, 2011.

*Primary Examiner* — Evan Pert
*Assistant Examiner* — Mark A Laurenzi
(74) *Attorney, Agent, or Firm* — Cantor Colburn LLP

(57) ABSTRACT

A method for manufacturing a back contact solar cell according to the present invention comprises the following steps: preparing a p-type silicon substrate having a via hole; performing a diffusion process to form an emitter layer all over the surface of the substrate; forming an etching mask on the front surface and back surface of the substrate so as to selectively expose a portion of the substrate; etching a portion of the thickness of the substrate in the region exposed to the etching mask so as to remove an emitter layer in the relevant region; forming an anti-reflection film on the front surface of the substrate; and forming a grid electrode on the front surface of the substrate, and forming an n-electrode and a p-electrode on the back surface of the substrate.

5 Claims, 7 Drawing Sheets

METHOD FOR MANUFACTURING A BACK CONTACT SOLAR CELL

TECHNICAL FIELD

The present disclosure relates to a method for manufacturing a back electrode-type solar cell, and more particularly, to a method for manufacturing a back electrode-type solar cell, which may improve short-wavelength optical response characteristic and transformation efficiency of a solar cell by forming a selective emitter layer and an isolation simultaneously through a single wet etching process.

BACKGROUND ART

A solar cell is a core element of solar-light power generation, which directly transforms solar light into electricity, and it may be basically considered as a diode having a p-n junction. Solar light is transformed into electricity by a solar cell as follows. If solar light is incident to a solar cell, an electron-hole (pair) is generated, and as the generated electrons and holes diffuse, due to the electric field formed at the p-n junction, electrons move to an n layer and holes move to a p layer, thereby generating photoelectromotive force between the p-n junctions. In this way, if a load or system is connected to both terminals of the solar cell, an electric power may flow to generate power.

A general solar cell is configured to have a front surface and a back electrode respectively at front and back surfaces of the solar cell. Since the front electrode is provided to the front surface which is a light-receiving surface, the light-receiving area decreases as much as the area of the front electrode. In order to solve the decrease of the light-receiving area, a back electrode-type solar cell has been proposed. The back electrode-type solar cell maximizes the light-receiving area of the front surface of the solar cell by providing a (+) electrode and a (−) electrode on a back surface of the solar cell.

The back electrode-type solar cell is classified into inter-digitated back contact (IBC), point contact type, emitter wrap through (EWT), metal wrap through (MWT) or the like. Among them, the MWT-type solar cell is configured so that, among a grid finger and a bus bar on the front surface, the grid finger remains on the front surface but the bus bar is moved to the back surface, and the grid finger on the front surface and the bus bar on the back surface are connected through a via hole formed through the substrate.

The MWT-type solar cell is configured as follows. As shown in FIG. 1, an emitter layer 102 is provided over the entire surface of a substrate 101, and an anti-reflection film 103 and a front grid electrode 104 are provided on the front surface of the substrate 101. In addition, an n electrode 105 and a p electrode 106 are provided at the back surface of the substrate 101 and electrically connected to the n electrode 105 and the front grid electrode 104 by means of the via hole 108 formed through the substrate 101.

Along with it, in order to prevent an electric short between the emitter layer 102 at the front surface of the substrate 101 and a p+ region at the back surface of the substrate 101 and a short between the n electrode 105 and the p electrode 106, isolating trenches 107 are respectively provided to the front and back surfaces of the substrate 101. The isolating trench 107 is generally formed by means of laser irradiation.

In the conventional MWT-type solar cell configured above, since the isolating trenches 107 are provided respectively to the front and back surfaces of the substrate 101, two laser processes must be performed. In addition, since the isolating trench 107 is provided at the front surface of the substrate 101, the light-receiving area is limited.

In addition, the emitter layer 102 is formed to have a uniform doping concentration, and the doping concentration should be high in order to minimize a contact resistance with the grid electrode 104. However, the emitter layer doped to the light receiving unit with a high concentration increases a recombination loss, and so the short-wavelength optical response characteristic is low.

DISCLOSURE

Technical Problem

The present disclosure is designed to solve the above problem and the present disclosure is directed to providing a method for manufacturing a back electrode-type solar cell, which may improve short-wavelength optical response characteristic and transformation efficiency of a solar cell by forming a selective emitter layer and an isolation simultaneously through a single wet etching process.

Technical Solution

In one general aspect, the present disclosure provides a method for manufacturing a back electrode-type solar cell, which includes: preparing a p-type silicon substrate having a via hole; forming a high-concentration emitter layer along a circumference of the substrate by a diffusing process; forming etching masks on front and back surfaces of the substrate so that the substrate is selectively exposed; etching a portion of the substrate to a predetermined thickness in a region exposed by the etching masks to remove the high-concentration emitter layer of the exposed region; forming an anti-reflection film on the front surface of the substrate; and forming a grid electrode at the front surface of the substrate and forming an n electrode and a p electrode at the back surface of the substrate.

The etching mask at the front surface of the substrate may be formed at a region where the grid electrode is to be formed, and the etching mask at the back surface of the substrate may be formed at a region where the n electrode is to be formed. In addition, in said etching a portion of the substrate to the predetermined thickness in the region exposed by the etching masks to remove the high-concentration emitter layer of the exposed region, a diffused byproduct layer is etched and removed together when the substrate is etched to the predetermined thickness, a non-exposed region on the front surface of the substrate includes the high-concentration emitter layer, and the exposed region on the front surface of the substrate includes a low-concentration emitter layer formed by the etching.

In another general aspect, the present disclosure provides a method for manufacturing a back electrode-type solar cell, which includes: preparing a p-type silicon substrate having a via hole; forming a high-concentration emitter layer along a circumference of the substrate by a diffusing process; etching the substrate to a predetermined thickness, other than a region in a front surface of the substrate where a grid electrode is to be formed and a region in a back surface of the substrate where an n electrode is to be formed, to remove the high-concentration emitter layer; forming an anti-reflection film on the front surface of the substrate; and forming a grid electrode at the front surface of the substrate and forming an n electrode and a p electrode at the back surface of the substrate.

In the etching of the substrate to the predetermined thickness, other than a region of a front surface of the substrate where a grid electrode is to be formed and a region of a back surface of the substrate where an n electrode is to be formed, to remove the high-concentration emitter layer, an etching paste is applied onto the substrate by ink-jet printing or screen printing to etch the substrate to the predetermined thickness, a non etched region on the front surface of the substrate includes the high-concentration emitter layer, and an etched region on the front surface of the substrate includes a low-concentration emitter layer formed by the etching.

Advantageous Effects

The method for manufacturing a back electrode-type solar cell according to the present disclosure gives the following effects.

Since the substrate is removed by a certain thickness by means of a single etching process at a specific region where an emitter layer is formed, isolation between the front and back surfaces of the substrate may be easily implemented. In addition, since an isolating trench is not provided by laser irradiation at the front surface of the substrate, the light-receiving area may be maximized.

BEST MODE

Figure 1:
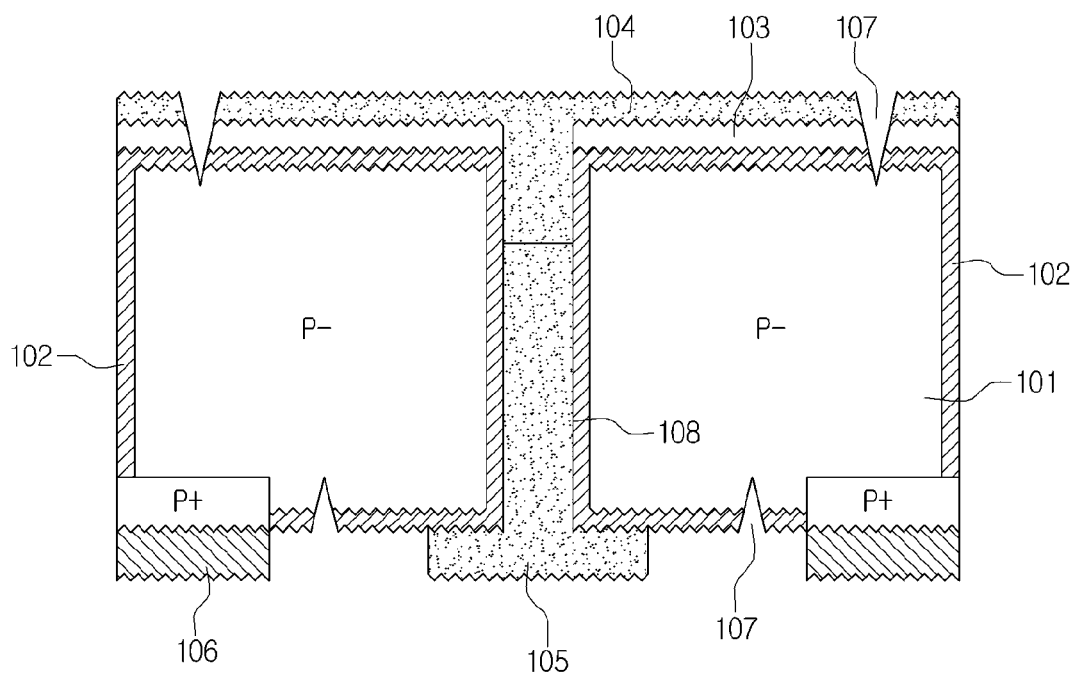
FIG. 1 is a diagram showing a conventional MWT-type solar cell.
Figure 2:
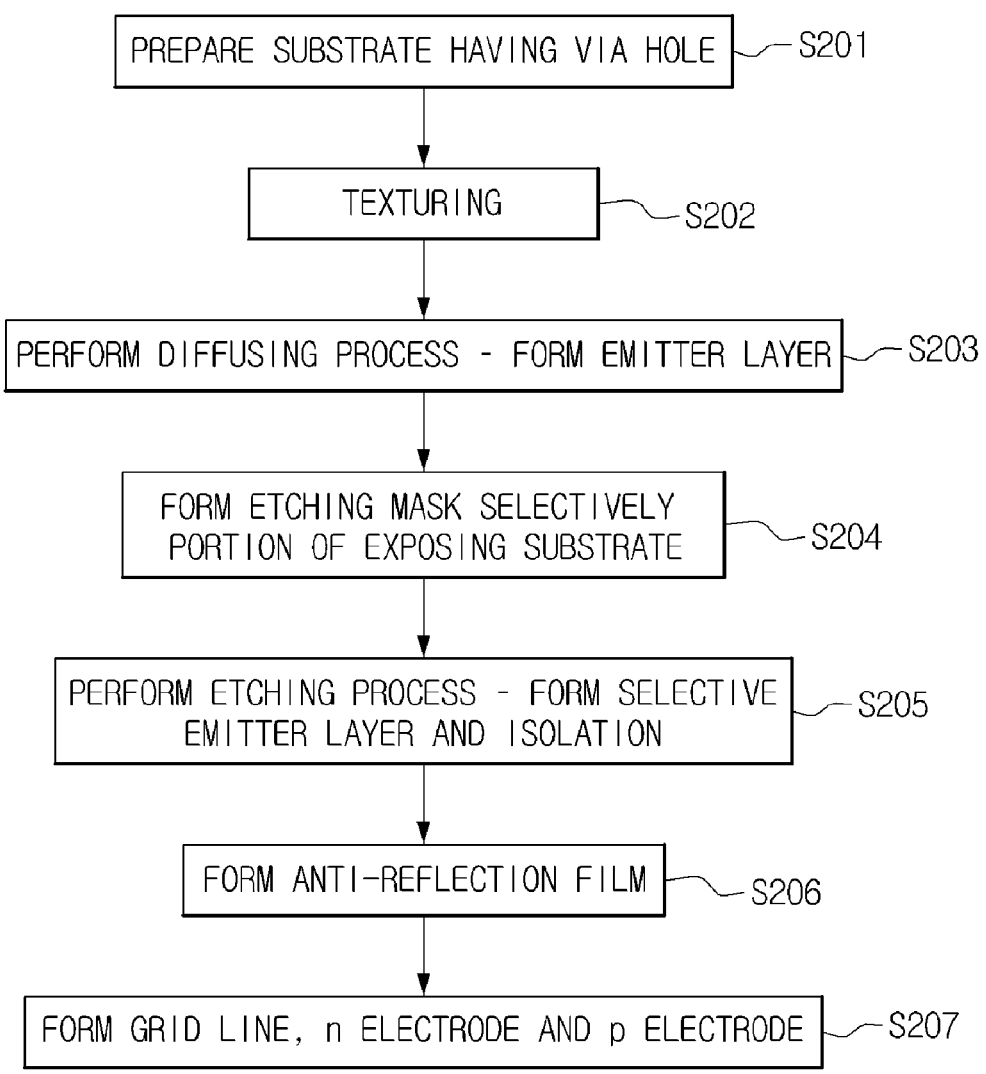
FIG. 2 is a flowchart for illustrating a method for manufacturing a back electrode-type solar cell according to an embodiment of the present disclosure.

Hereinafter, a method for manufacturing a back electrode-type solar cell according to an embodiment of the present disclosure will be described in detail with reference to the accompanying drawings. FIG. 2 is a flowchart for illustrating a method for manufacturing a back electrode-type solar cell according to an embodiment of the present disclosure, and FIGS. 3a to 3f are cross-sectional views for illustrating the method for manufacturing a back electrode-type solar cell according to an embodiment of the present disclosure.

Figure 3A:
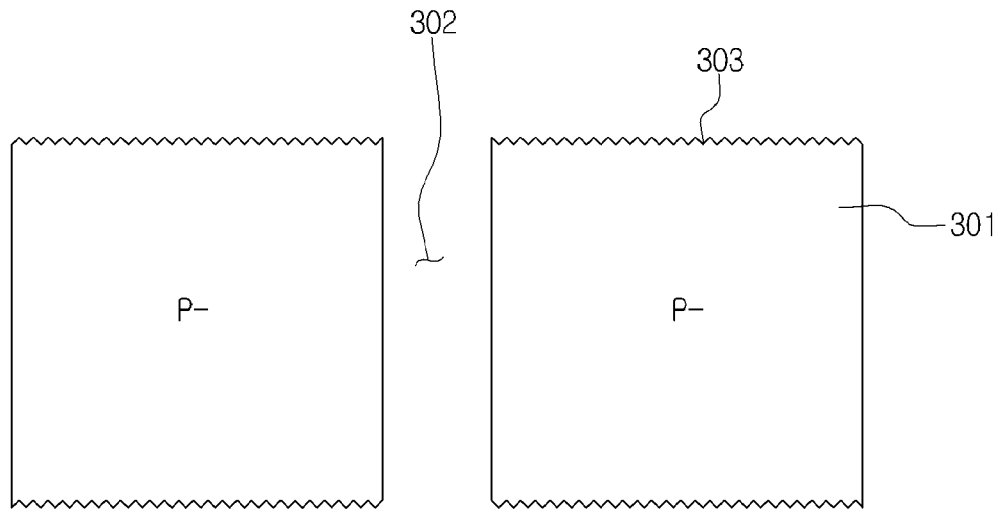
FIGS. 3a to 3f are cross-sectional views for illustrating the method for manufacturing a back electrode-type solar cell according to an embodiment of the present disclosure.

First, as shown in FIGS. 2 and 3a, a first conductive crystalline silicon substrate 301 is prepared, and via holes 302 are vertically formed through the substrate 301 at regular intervals (S201). After that, a texturing process is performed to form unevenness 303 on the surface of the first conductive silicon substrate 301 (S202). The texturing process is performed to reduce light reflection at the surface of the substrate 301, and may be performed by wet etching or dry etching such as reactive ion etching. The first conductive type may be p-type or n-type, and the second conductive type is opposite to the first conductive type. The following description will be based on that the first conductive type is p-type.

Figure 3B:
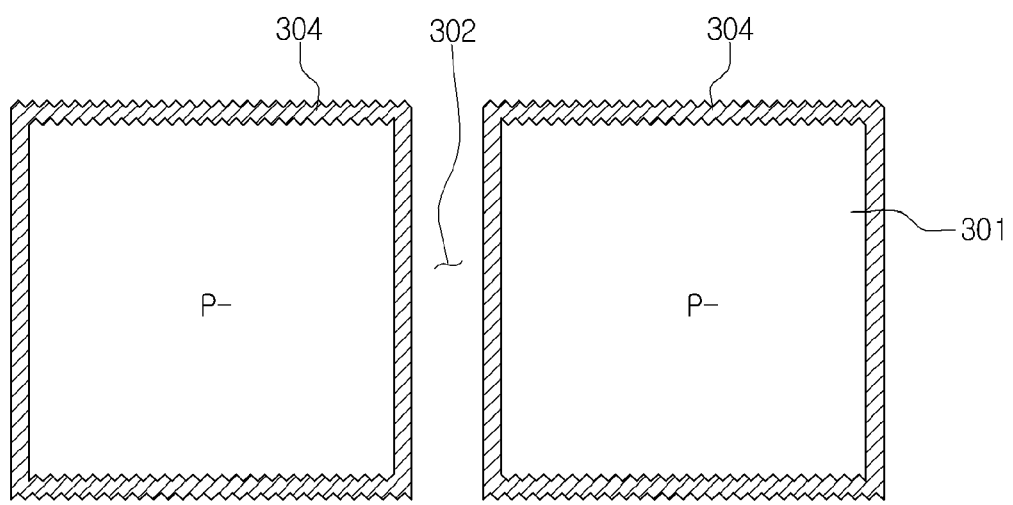

In a state where the texturing process is completed, as shown in FIG. 3b, a diffusing process is performed to form an emitter layer 304 (n+) (S203). In detail, the silicon substrate 301 is provided in a chamber, and second conductive impurity ions, namely gas (for example, $POCl_3$) containing n-type impurity ions, is supplied into the chamber so that phosphorus (P) ions are diffused into the substrate 301. Accordingly, the emitter layer 304 is formed along a circumference of the substrate 301 by a predetermined thickness, and the emitter layer 304 is also formed in the substrate 301 around the via hole 302 similarly.

Other than the method of gas as described above, the process of diffusing the n-type impurity ions may also use a method of immersing the silicon substrate 301 in a solution containing n-type impurity ions, for example a phosphorous acid ($H_3PO_4$) solution, followed by thermal treatment so that the phosphorus (P) ions are diffused into the substrate 301 to form the emitter layer 304. In addition, in a case where the second conductive impurity ions are p-type, the impurity ions forming the emitter layer 304 may be boron (B).

Due to the diffusing process, the emitter layer 304 is formed in the entire surface of the substrate 301 by a predetermined depth, and a phosphor-silicate glass (PSG) film (not shown) is formed at the surface of the substrate 301. The PSG film is a diffused byproduct layer formed as the phosphorus (P) ions react with silicon (Si) or the like of the silicon substrate 301. In a case where p-type boron (B) is used as the second conductive impurity ions, a boro-silicate glass (BSG) film generated by reaction of boron (B) and silicon (Si) may be used as the diffused byproduct layer, instead of the PSG.

Figure 3C:
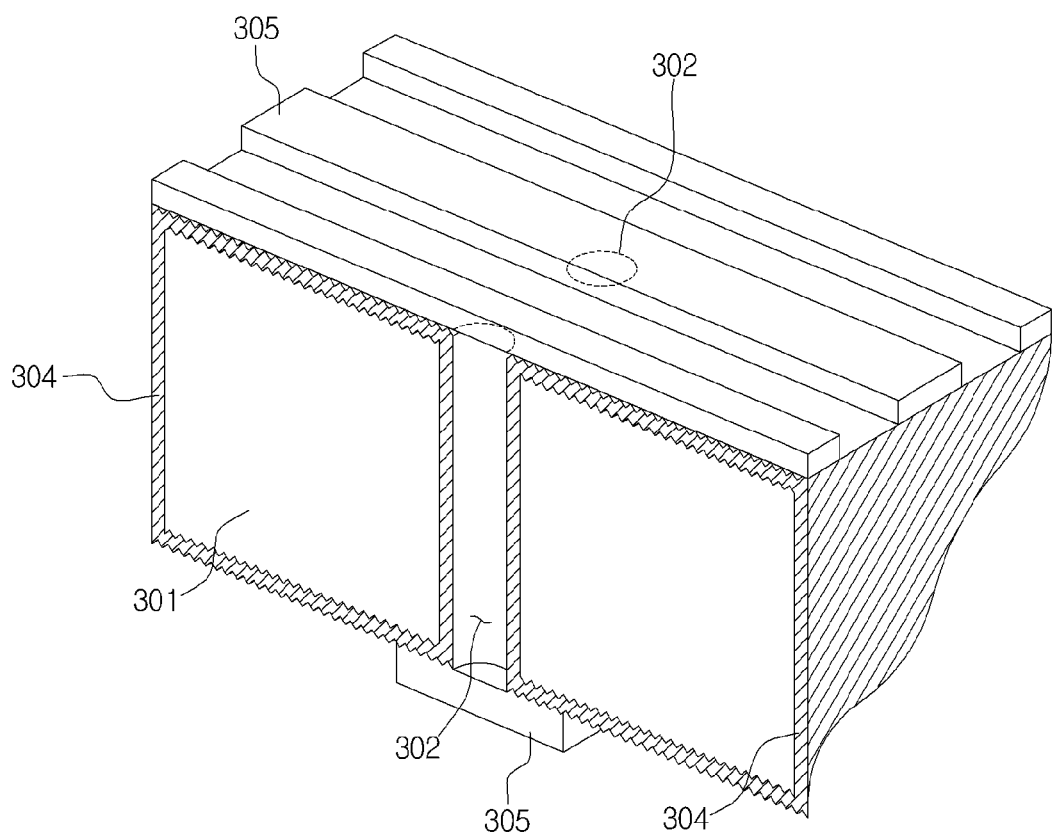

In this state, as shown in FIG. 3c, etching masks 305 are respectively formed on the front and back surfaces of the substrate 301 (S204). Only specific regions of the front and back surfaces of the substrate 301 are selectively exposed by the etching mask 305. The etching mask 305 at the front surface of the substrate 301 is provided on a portion of the diffused byproduct layer where a grid line 307 is to be formed, and the etching mask 305 at the back surface of the substrate 301 is provided on a portion of the diffused byproduct layer where the n electrode 308 is to be formed. The diffused byproduct layer other than the above regions is exposed.

Figure 3D:
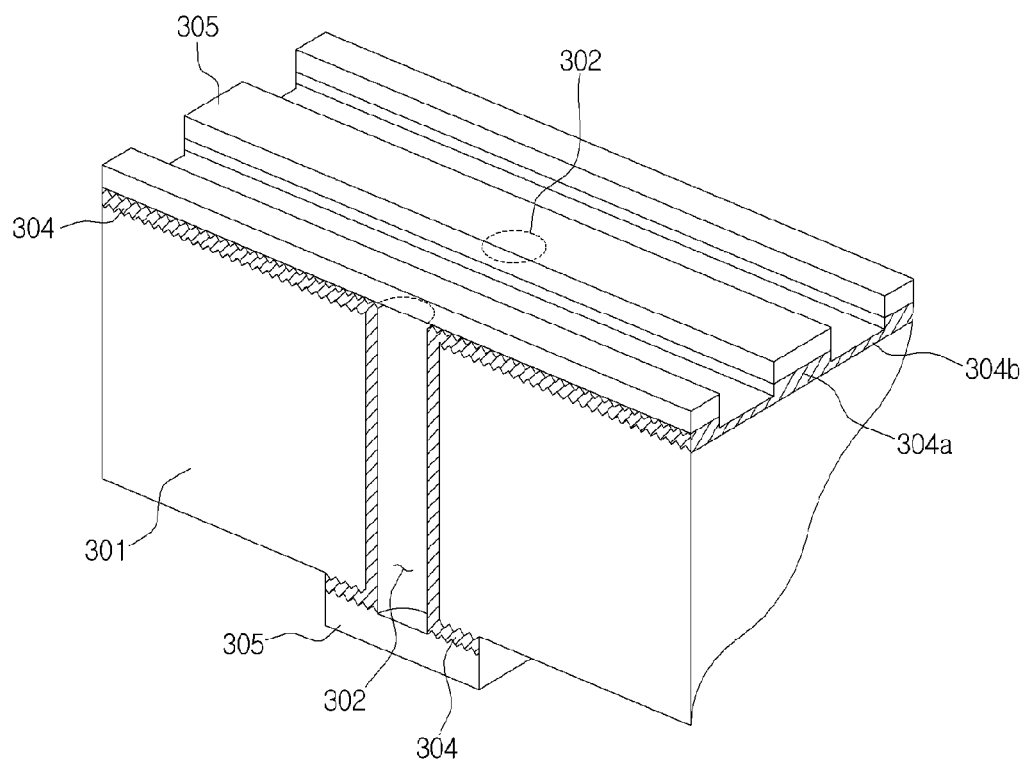

In a state where the etching mask 305 is provided, as shown in FIG. 3d, a wet etching process is performed to etch and remove the diffused byproduct layer selectively exposed by the etching mask 305 and the substrate 301 provided below it by a predetermined thickness (S205). In case of the front surface of the substrate 301, the emitter layer 304 may be removed entirely or partially. By doing so, a high-concentration emitter layer 304a is formed at the portion protected by the etching mask 305, and the portion of the emitter layer etched by a predetermined thickness is converted into a low-concentration emitter layer 304b.

Since not only the diffused byproduct layer in the exposed region but also the emitter layer 304 below it are removed together and also the emitter layer 304 at the side of the substrate is removed, an isolation effect is additionally provided between the front and back surfaces of the substrate 301. The wet etching process may be performed by immersing the entire substrate 301 in an etching solution or by successively immersing the other surface and one surface of the substrate 301 in an etching solution.

Instead of the above method for forming the etching mask 305 and immersing the substrate in an etching solution, specific regions of the diffused byproduct layer and the substrate 301 may be removed by a predetermined thickness in a state where the etching mask 305 is not formed. In detail, an etching paste is applied to a specific region by ink-jet printing or screen printing to remove the corresponding region of the diffused byproduct layer and the substrate 301 by a predetermined thickness. The specific region designates a portion where a grid line 307 is not formed in case of the front surface of the substrate 301 and a portion where an n electrode 308 is not formed in case of the back surface of the substrate 301.

Figure 3E:
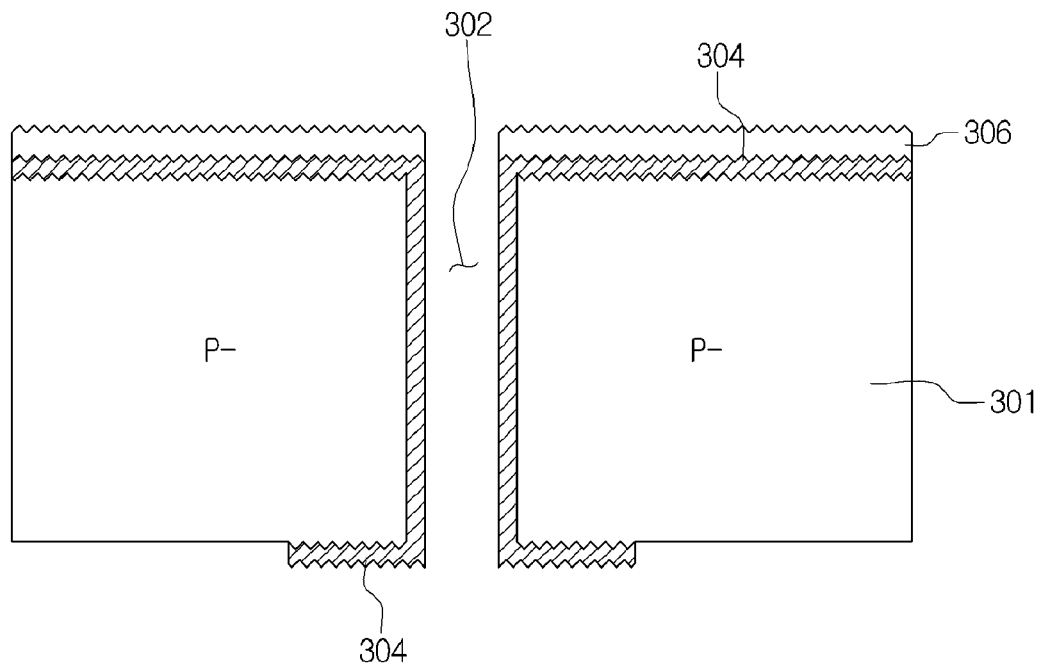

After the process of removing the diffused byproduct layer and the substrate 301 by a predetermined thickness is completed, the etching mask 305 and a residual diffused byproduct layer are removed. After that, as shown in FIG. 3e, an anti-reflection film 306 is formed on the front surface of the substrate 301 by means of plasma enhanced chemical vapor deposition (PECVD) or the like (S206). The anti-reflection film 306 may be configured with a silicon nitride film ($Si_3N_4$).

In this state, silver paste (Ag paste) is applied by means of screen printing or the like to a portion where the n electrode 308 is to be formed. Screen printing is performed from the back surface of the substrate 301, and accordingly silver paste is also filled in the via hole 302. Subsequently, aluminum paste (Al paste) is applied to a portion of the back surface of the substrate 301 where the p electrode 309 is to be formed. Finally, silver paste is applied onto the anti-reflection film 306 where the grid line 307 is to be formed.

Figure 3F:
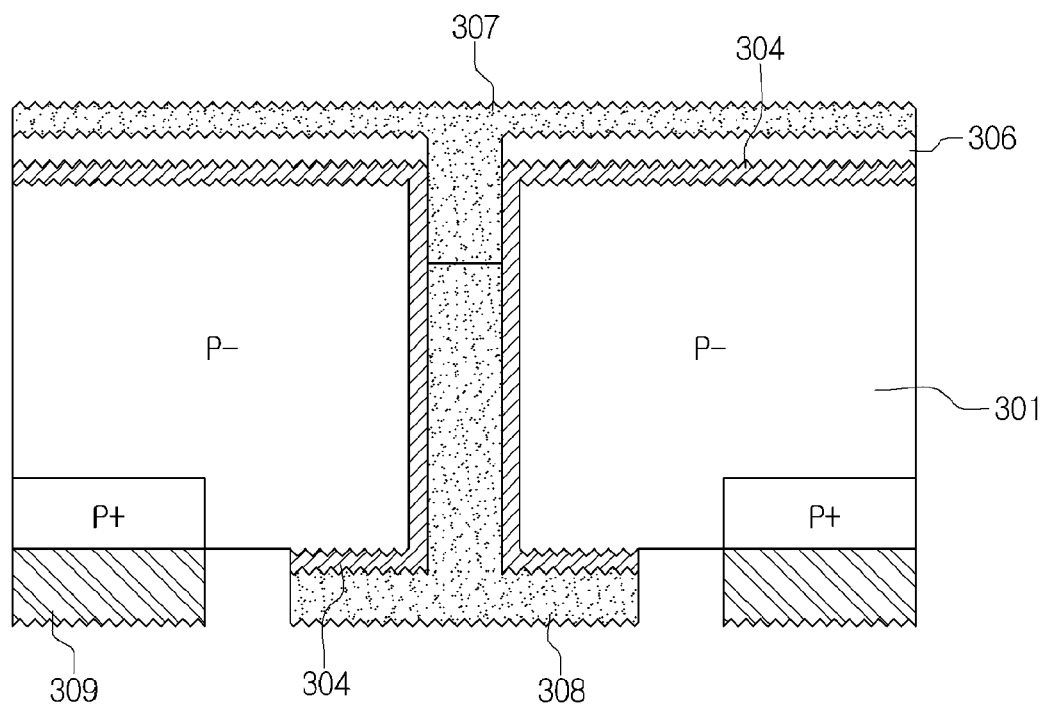

After that, if a firing process is performed to form the grid line 307, the n electrode 308 and the p electrode 309 as shown in FIG. 3f, the method for manufacturing a back electrode-type solar cell according to an embodiment of the present disclosure is completed (S207). By the firing process, the grid line 307 is formed at the front surface of the substrate 301, and the n electrode 308 and the p electrode 309 are formed at the back surface of the substrate 301. In addition, due to the firing process, a part of aluminum (Al) of the p electrode 309 penetrates into the substrate 301, thereby forming a back surface field (p+).

INDUSTRIAL APPLICABILITY

Since the substrate is removed by a certain thickness by means of a single etching process at a specific region where an emitter layer is formed, isolation between the front and back surfaces of the substrate may be easily implemented. In addition, since an isolating trench is not provided by laser irradiation at the front surface of the substrate, the light-receiving area may be maximized.

The invention claimed is:

1. A method for manufacturing a back electrode-type solar cell, comprising:
   preparing a p-type silicon substrate having a via hole;
   forming a high-concentration emitter layer along a circumference of the substrate by a diffusing process;
   forming etching masks on front and back surfaces of the substrate so that the substrate is selectively exposed;
   etching a portion of the substrate to a predetermined thickness in a region exposed by the etching masks to remove the high-concentration emitter layer of the exposed region;
   forming an anti-reflection film on the front surface of the substrate; and
   forming a grid electrode at the front surface of the substrate and forming an n electrode and a p electrode at the back surface of the substrate.

2. The method for manufacturing a back electrode-type solar cell according to claim 1, wherein the etching mask on the front surface of the substrate is formed at a region where the grid electrode is to be formed, and the etching mask on the back surface of the substrate is formed at a region where the n electrode is to be formed.

3. The method for manufacturing a back electrode-type solar cell according to claim 1, in said etching a portion of the substrate to the predetermined thickness in the region exposed by the etching masks to remove the high-concentration emitter layer of the exposed region,
   wherein a diffused byproduct layer is etched and removed together when the substrate is etched to the predetermined thickness,
   wherein a non-exposed region on the front surface of the substrate includes the high-concentration emitter layer, and
   wherein the exposed region on the front surface of the substrate includes a low-concentration emitter layer formed by the etching.

4. A method for manufacturing a back electrode-type solar cell, comprising:
   preparing a p-type silicon substrate having a via hole;
   forming a high-concentration emitter layer along a circumference of the substrate by a diffusing process;
   etching the substrate to a predetermined thickness, other than a region in a front surface of the substrate where a grid electrode is to be formed and a region in a back surface of the substrate where an n electrode is to be formed, to remove the high-concentration emitter layer;
   forming an anti-reflection film on the front surface of the substrate; and
   forming a grid electrode at the front surface of the substrate and forming an n electrode and a p electrode at the back surface of the substrate.

5. The method for manufacturing a back electrode-type solar cell according to claim 4, in said etching of the substrate to the predetermined thickness, other than a region of a front surface of the substrate where a grid electrode is to be formed and a region of a back surface of the substrate where an n electrode is to be formed, to remove the high-concentration emitter layer,
   wherein an etching paste is applied onto the substrate by ink-jet printing or screen printing to etch the substrate to the predetermined thickness,
   wherein a non etched region on the front surface of the substrate includes the high-concentration emitter layer, and
   wherein an etched region on the front surface of the substrate includes a low-concentration emitter layer formed by the etching.

* * * * *